United States Patent
Bald

(10) Patent No.: US 6,744,259 B2
(45) Date of Patent: *Jun. 1, 2004

(54) SYSTEM AND METHOD FOR VERIFYING FAILURE DETECT CIRCUITRY IN SAFETY COMPLIANCE TEST INSTRUMENTS

(75) Inventor: Roger A. Bald, Round Lake Beach, IL (US)

(73) Assignee: Associated Research, Inc., Lake Forest, IL (US)

( * ) Notice: Subject to any disclaimer, the term of this patent is extended or adjusted under 35 U.S.C. 154(b) by 113 days.

This patent is subject to a terminal disclaimer.

(21) Appl. No.: 10/178,348

(22) Filed: Jun. 25, 2002

(65) Prior Publication Data

US 2003/0234652 A1 Dec. 25, 2003

(51) Int. Cl.⁷ .......................... G01R 31/12; G06F 19/00; G09G 5/00
(52) U.S. Cl. .................. 324/551; 324/73.1; 702/119; 702/120; 702/121; 345/771; 345/772
(58) Field of Search .................. 324/551, 541, 324/544, 73.1, 510–511, 545, 76.61; 345/771–772; 702/119–123

(56) References Cited

U.S. PATENT DOCUMENTS

| | | | |
|---|---|---|---|
| 3,737,765 A | | 6/1973 | Lee et al. .................... 324/510 |
| 3,829,842 A | | 8/1974 | Langdon et al. ............ 700/159 |
| 4,398,188 A | | 8/1983 | Feigal et al. ................ 340/650 |
| RE31,864 E | | 4/1985 | Van Bavel et al. ........... 714/36 |
| 5,056,059 A | | 10/1991 | Tivig et al. ................. 345/828 |
| 5,097,213 A | * | 3/1992 | Hunting et al. ............. 324/538 |
| 5,101,160 A | | 3/1992 | Barjonnet et al. ........... 324/510 |
| 5,115,407 A | * | 5/1992 | Bird et al. ................... 702/121 |
| 5,321,420 A | | 6/1994 | Rezek et al. ............. 345/440.1 |
| 5,390,194 A | * | 2/1995 | Mannle ....................... 714/744 |
| 5,481,194 A | | 1/1996 | Schantz et al. ............. 324/522 |
| 5,808,920 A | | 9/1998 | Zwan et al. ................ 702/120 |
| 5,861,882 A | * | 1/1999 | Sprenger et al. ............ 345/700 |
| 6,011,398 A | | 1/2000 | Bald et al. .................. 324/511 |
| 6,054,865 A | | 4/2000 | Bald et al. .................. 324/551 |
| 6,064,372 A | | 5/2000 | Kahkoska ................... 345/173 |
| 6,091,188 A | | 7/2000 | Tomihari et al. ........... 313/336 |
| 6,515,484 B1 | * | 2/2003 | Bald et al. .................. 324/551 |

* cited by examiner

*Primary Examiner*—Anjan K. Deb
(74) *Attorney, Agent, or Firm*—Bacon & Thomas, PLLC

(57) ABSTRACT

A safety compliance test instrument includes a display capable of displaying prompts, a menu display program, software for displaying a plurality of instrument verification menus, prompts, and messages concerning results of the verification tests, and software for enabling or preventing safety compliance tests from being performed depending on results of the verification. The safety compliance instrument includes at least two different safety compliance tests involving different connections to a device under test. The tests may be selected from the group consisting of a continuity test, a ground test, a dielectric withstand test, and an insulation resistance test, and more specifically from the group consisting of a continuity test, a ground bond test, AC and DC dielectric withstand tests, and an insulation test. The verification system of the invention may be implemented on any test instrument having an interactive display capable of presenting a series of menus, and of having the operator select options presented by the menus, including instruments with full keyboards rather than softkeys, or with cursor control type inputs, as well as one or two line displays that require scrolling.

13 Claims, 4 Drawing Sheets

SYSTEM AND METHOD FOR VERIFYING FAILURE DETECT CIRCUITRY IN SAFETY COMPLIANCE TEST INSTRUMENTS

BACKGROUND OF THE INVENTION

1. Field of the Invention

The present invention relates to electrical safety compliance test equipment, and in particular to:

(i) a system and method for verifying that detection circuitry in the test equipment will properly detect failure in a sample to be tested or device-under-test (DUT), and (ii) a safety compliance test instrument that includes a built-in verification feature.

The verification system and method of the invention is preferably implemented by software that displays a series of user prompts upon start-up of the test instrument. The prompts guide the user through all of the steps needed to perform a verification test, including which leads need to be connected or disconnected.

2. Description of Related Art

Electrical safety compliance test instruments are used by manufacturers to test electrical products for hazards such as insulation or ground faults that could cause injuries to purchasers and users of the products. Conventional safety compliance tests include continuity, ground bond, AC and DC dielectric withstand or "hipot," insulation resistance, line leakage, and run tests. For convenience, it is common for safety compliance instruments to be capable of performing more than one of these tests.

If fail detection circuitry in the test equipment are not operating properly, the equipment may fail to detect defective products. As a result, it is critical that the ability of the fail detection circuitry to detect test failures be periodically verified. Such verification is conventionally accomplished through the use of external text boxes that can be connected to the test instrument in place of the sample to be tested, and that are used during verification to simulate a defective product and thereby verify instrument performance. However, verification test boxes are costly and inconvenient to store and use.

The main reason for using external test boxes is that they eliminate the need for the operator to make the necessary connections to simulate product failure. Generally, this simply involves establishing a short between the appropriate test terminals, and could be accomplished without the need for a test box by an operator having proper training and sufficient alertness. However, given the criticality of proper product testing, and human nature, manufacturers and safety inspectors are unwilling to rely on the operator alone, particularly with respect to instruments capable of performing multiple different types of safety compliance tests involving different lead configurations.

The system and method of the invention address this problem by providing built-in verification capabilities that permit manufactures of electrical products to satisfy safety agency requirements for verification, without the inconvenience and cost of external test boxes, by providing an interactive display system that instructs the equipment operator on how to connect the leads to perform verification for a particular test, and that ensures that the verification results will be properly interpreted. So long as the operator follows the instructions provided by the system and method of the invention, it is impossible for the operator to, for example, mistakenly use a continuity test lead configuration to verifying the functioning of hipot detectors.

This capability should not be confused with the capability of providing on-screen prompts that guide an operator in setting-up the safety compliance tests themselves, i.e., that instruct the operator on connecting leads to the sample to be tested, rather than on setting-up a verification test of the test circuitry. On-screen safety compliance test set-up prompts are disclosed in U.S. patent application Ser. No. 09/699,331, filed Oct. 31, 2000, and herein incorporated by reference.

In addition, the present invention is to be distinguished from fully automated safety compliance testing systems and methods in which set-up, testing, and verification is carried-out solely under computer control via a single pre-configured test interface to the device under test, rather than by having the operator switch connections for the various tests, such as disclosed in U.S. Pat. No. 5,861,882. Such systems, as explained in the abstract of U.S. Pat. No. 5,861,882, seek to dynamically reconfigure the test set up for different tests without hand rewiring, and thus lack the flexibility of discrete test instruments, while at the same costing far more.

Finally, the present invention is to be distinguished from devices having automated self-test functions, such as fire alarms, in which detectors are periodically checked for proper functions. The type of verification with which the present invention is concerned seeks not just to test a single component, but to simulate an actual test to determine whether failures can be properly detected. For example, it may be that the detector is functioning properly, but that there is a short elsewhere in the power circuitry that precludes proper functioning of the tester so that self-testing of a single component would not detect the error.

A specific example of safety compliance test equipment with self-test functions or circuitry, is disclosed in U.S. Pat. No. 5,481,194. As explained in the abstract of this patent, a "built-in test circuit tests whether the fault detection circuit is operating correctly." While useful in equipment that does not permit different test lead configurations, this type of fully automated self-test circuitry does not eliminate the need for the present invention in a multifunction tester having different test configurations, and which therefore requires either a test box or operator intervention during verification.

U.S. Pat. Nos. 6,091,188; 4,398,188; and 3,737,765 also disclose self-test circuits in ground circuit or high voltage monitoring systems, but the monitoring systems of these patents are permanently connected to the systems being monitored, and the self-tests are conducted automatically at regular intervals rather than in response to operator input.

U.S. Pat. No. Re. 31,864 is of interest for its disclosure of an appliance self-test feature in which the operator is prompted to participate in the self-test by pressing keys on a keyboard, although the operator is not prompted with respect to test lead configurations.

U.S. Pat. No. 3,829,842 is of interest for its disclosure of an controller self-test function that automatically adapts to the equipment being controlled, and that permits manual testing of controller functions.

U.S. Pat. Nos. 6,064,372 and 5,861,882 are cited as background for their general disclosures of menu-driven interfaces for test equipment. The equipment described in these patents lack self-test or test circuit verification functions.

Also by way of background, examples of test instruments having programmable displays suitable for carrying out the verification system and method of the invention, though not in the context of safety compliance test instruments, include the medical diagnostic instrument display disclosed in U.S. Pat. No. 5,056,059, the communications line test device disclosed in U.S. Pat. No. 5,808,920, voltage-current multimeter displays such as the one disclosed in U.S. Pat. No. 6,064,372, which eliminate the need for multiple buttons by including a touch screen, and oscilloscope displays, including the softkey controlled oscilloscope display described in U.S. Pat. No. 5,321,420.

Finally, examples of safety compliance test equipment displays that are especially suitable for implementing the invention include the scrolling displays integrated into the test instruments disclosed in U.S. patent application Ser. No. 09/699,331, cited above, and U.S. Pat. Nos. 6,054,865 and 6,011,398 (which correspond to instruments commercially available from Associated Research, Inc of Lake Forest, Ill.), or the test instrument disclosed in U.S. Pat. No. 5,101,160. It will of course be appreciated, however, that the system and method of the invention are not to be limited to any particular display or safety compliance test instrument.

SUMMARY OF THE INVENTION

It is a accordingly a first objective of the invention to provide a verification system and method that enables verification of a safety compliance instrument's fail detection test circuitry without the need for an external verification box, and yet with minimal risk that an operator will set-up the verification test incorrectly.

It is a second objective of the invention to provide a safety compliance test instrument having a reduced risk that fail detector circuitry will give an incorrect reading due to operator error during testing.

It is a third objective of the invention to provide a test verification software that may easily be installed on existing safety compliance test instruments with programmable interactive displays.

These objectives of the invention are achieved, in accordance with the principles of a preferred embodiment of the invention, by providing a verification system and method in which prompts for set-up of individual verification tests are supplied through an interactive, menu-driven display which guides the operator through the proper set-up procedure and displays the results of the verification tests in a way that ensures that they will not be misinterpreted.

The objectives of the invention are further achieved by providing a safety compliance test instrument having a display capable of displaying menus and prompts, means by which an operator may input responses to displayed menus, and software for displaying a plurality of instrument verification menus, prompts, and messages concerning lead-configurations for, and results of, the instrument verification tests.

According to an especially preferred embodiment of the invention, the safety compliance instrument includes at least two different safety compliance tests to be verified, the at least two different safety compliance tests requiring different connections to a device under test. The tests may be selected from the group consisting of a continuity test, a ground test, a dielectric withstand test, and an insulation resistance test, and more specifically from the group consisting of a continuity test, a ground bond test, AC and DC dielectric withstand tests, and an insulation resistance test.

It will be appreciated by those skilled in the art that the verification system of the invention may be implemented on any test instrument having an interactive display capable of presenting a series of menus, and of having the operator select options presented by the menus, including instruments with full keyboards rather than softkeys, or with cursor control type inputs, as well as one or two line displays that require scrolling.

Although a particular type of safety compliance test instrument is described in detail herein, those skilled in the art will appreciate that the principles of the preferred embodiment of the invention may be applied to line leakage testers, run testers, and a variety of other test instruments capable of running multiple pre-programmed test sequences requiring multiple test lead configurations.

DETAILED DESCRIPTION OF THE PREFERRED EMBODIMENTS

Figure 1:
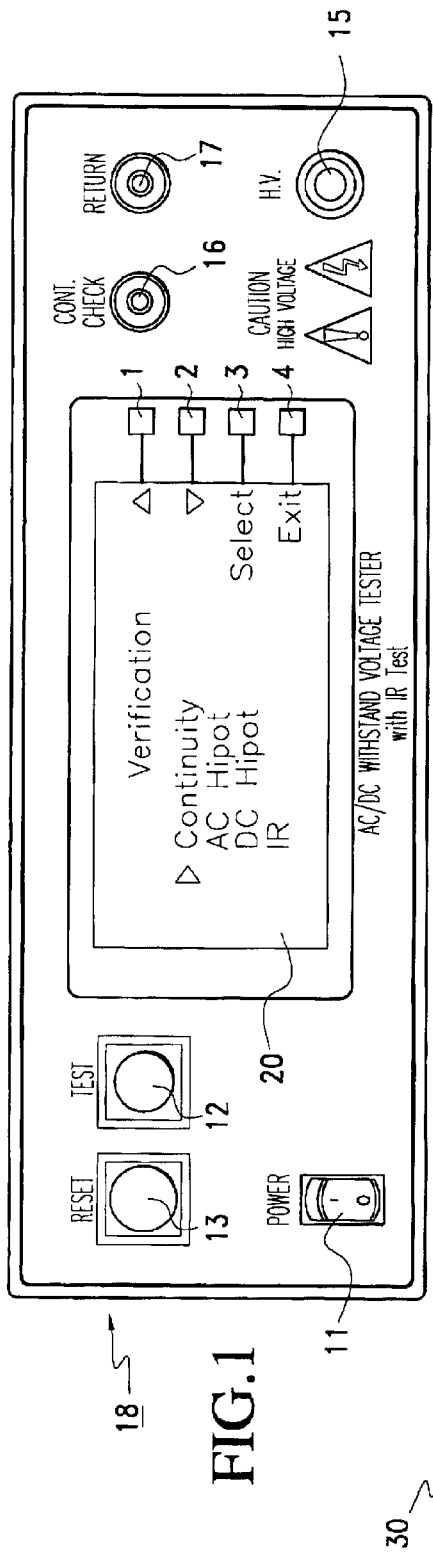
FIG. 1 is a front elevation of a safety compliance test instrument in which the verification feature of the invention may be installed.

FIG. 1 illustrates the front panel 18 of a safety compliance instrument which may be programmed to include a verification system according to the principles of a preferred embodiment of the invention. The front panel 18 includes a display screen 20 through which the verification system is accessed, and on which a plurality of softkey-controlled pages or sub-menus are displayed. In addition, the front panel 18 includes four softkeys 1–4, and may further include non-softkey data or control inputs such as a numeric keypad, cursor control keys, an "enter" or "input" key, and/or an "exit" key.

Figure 2:
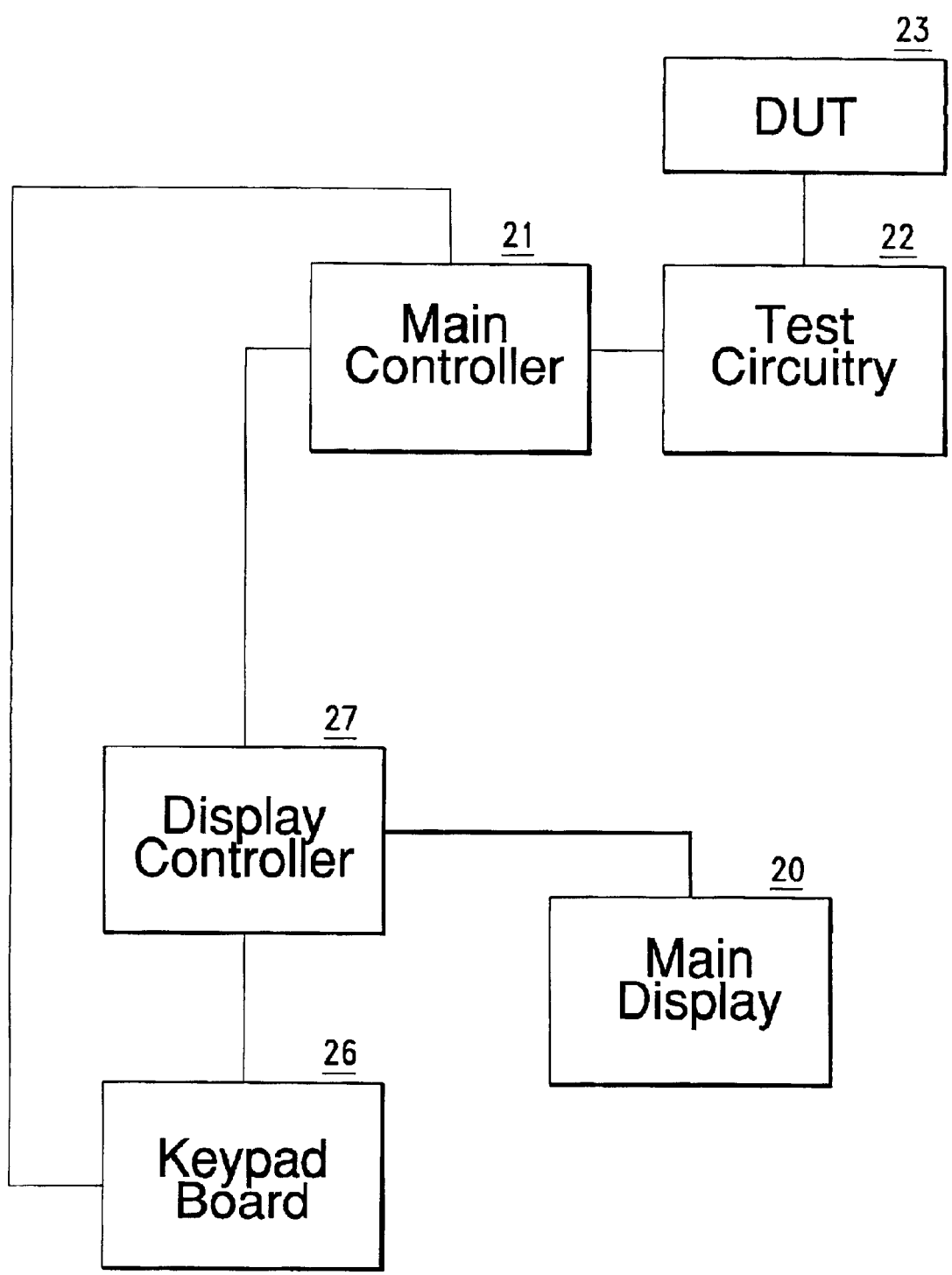
FIG. 2 is a block diagram illustrating principal components of the multifunction safety compliance test instrument illustrated in FIG. 1.

The test instrument illustrated in FIG. 2 is a type of safety compliance tester known as a "hipot" or dielectric withstand tester, which applies a high DC or AC voltage to a product and monitors for leakage currents in order to test whether insulation in the product can withstand the applied high voltage. As a result, the front panel of the illustrated test instrument includes, in addition to the operator interface, on/off, test, and reset switches 11,12,13, and respective high voltage, current, and return jacks 14,15,16.

Figure 3:
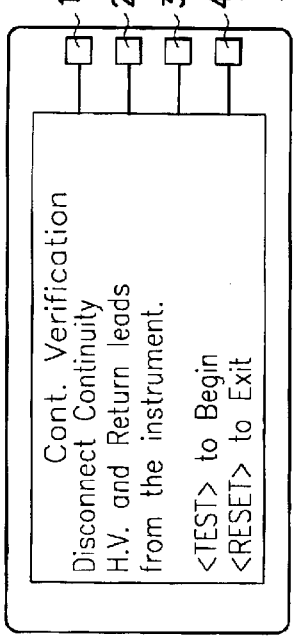
FIGS. 3, 4A–4C, 5A–5C, 6A–6C, and 7A–7C are illustrations or screen shots of various menus and submenus used by the system and method of a preferred embodiment of the invention.

FIG. 3 shows that the circuitry of the preferred test instrument may include a main controller 21 corresponding generally to the controller described in the U.S. Pat. No. 6,054,865, test circuitry 22 made up of power conditioning, rectifier, amplifier, and protection circuits as necessary to enable the desired tests to be performed on the sample to be tested or device-under-test 23. In addition, the preferred test instrument may include a keypad-control board 26 and a display screen controller 27. The screen controller 27 may be in the form of a separate microprocessor connected to the main controller 21 and to the keypad control board 26, or it may be integrated into the main controller and possibly share a microprocessor.

Those skilled in the art will appreciate that numerous display control microprocessors are currently available for controlling the display and carrying out the desired display functions, as described in more detail below, and that the invention should not be limited to a particular circuit configuration or microprocessor arrangement.

The illustrated display screen 20 is a liquid crystal display (LCD), and may alternatively be in the form of a color liquid crystal display, cathode ray tube (CRT), or any other display screen capable of displaying the menus and submenus described below, while the softkeys 1–6 are assigned to a memory location or register whose function depends on the menu displayed on the screen. Operation of softkeys is well-known in connection with displays other than those used in electrical safety compliance test instruments or equipment, as described, for example, in U.S. Pat. No. 5,321,420, herein incorporated by reference.

It will be appreciated by those skilled in the art that the verification system of the invention may be implemented on any safety compliance test instrument having an interactive display capable of presenting a series of menus, and of having the operator select options presented by the menus, including instruments with full keyboards rather than softkeys, or with cursor control type inputs, as well as one or two line displays that require scrolling, such as the multiple function dielectric withstand tester described in U.S. Pat. No. 6,054,865, assigned to Associated Research, Inc., which is capable of performing at least five different types of tests, including high voltage AC and DC dielectric withstand tests, insulation resistance tests, AC ground bond tests, and DC continuity tests, all of which require different connections between the tester and the device under test. The verification system of the invention may also be installed on a safety compliance instrument of the type disclosed in U.S. patent application Ser. No. 09/699,331, filed Oct. 31, 2000.

Figure 7A:
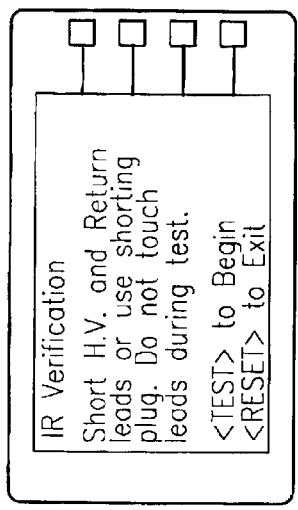
Figure 7B:
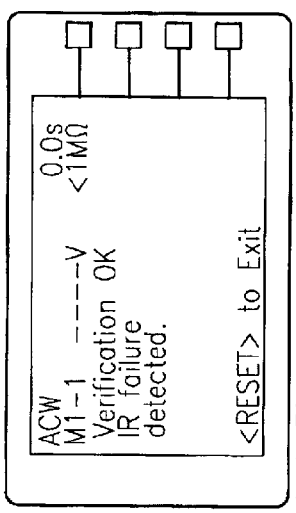
Figure 7C:
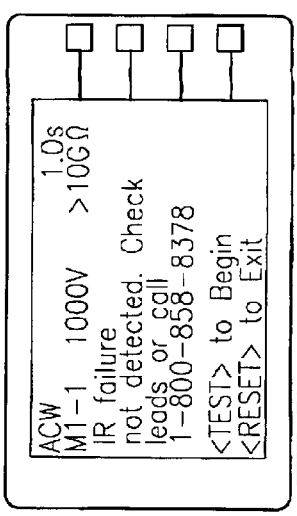
Figure 8:
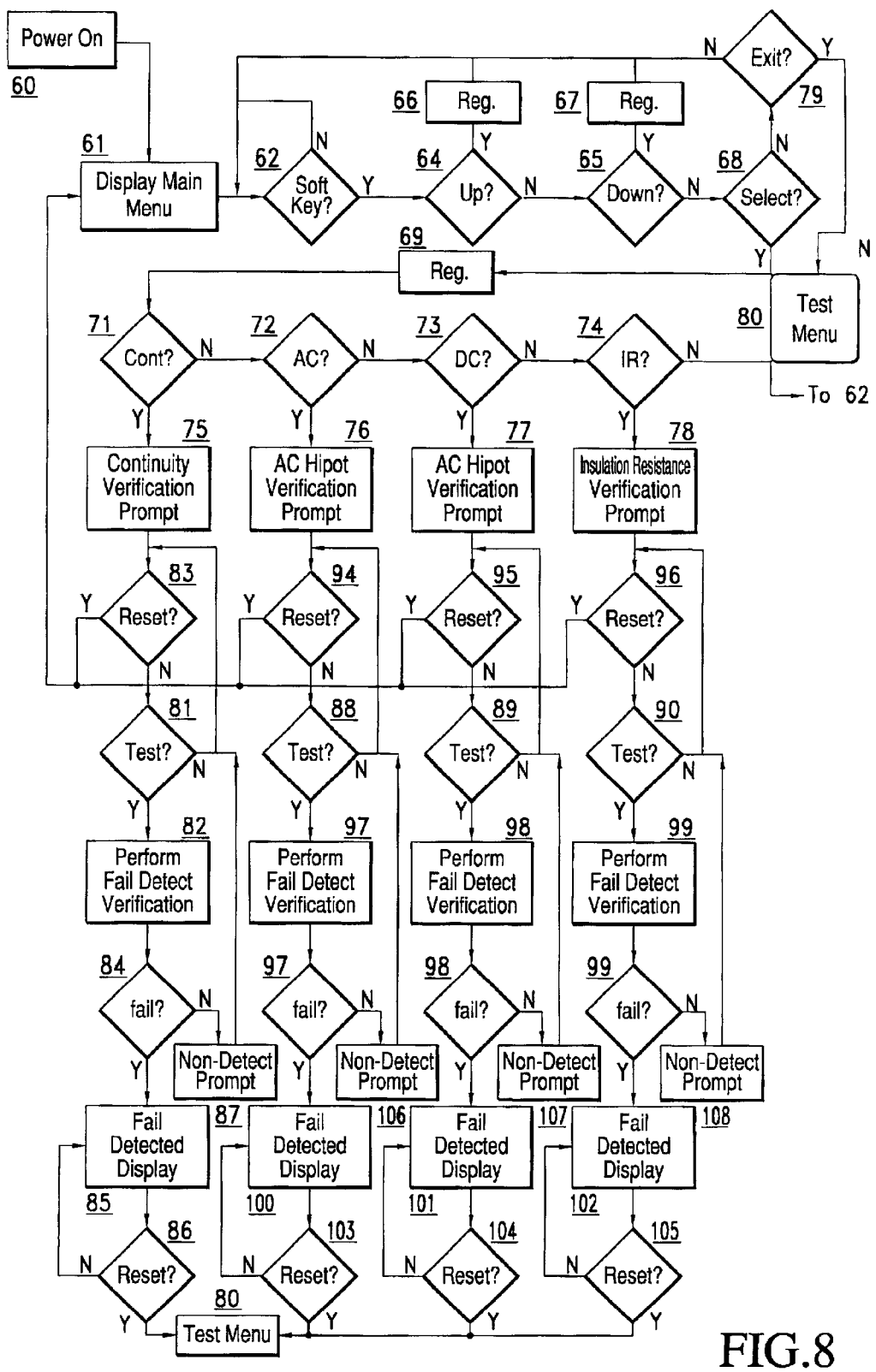
FIG. 8 is a flowchart illustrating a safety compliance test verification method according to the principles of a preferred embodiment of the invention.

FIG. 8 is a flowchart of a preferred embodiment of the verification procedure of the invention, while FIGS. 3, 4A–4C, 5A–5C, 6A–6C, and 7A–7C show various menus and submenus displayed during the verification procedure. Each of these menus requires just four softkeys, although of course other softkeys may be utilized as necessary.

The method of the invention preferably begins upon power-up of the safety compliance instrument (step 60), at which time a verification menu 30 shown in FIG. 3 is displayed (step 61). This menu permits the user to select from among four types of tests to be verified using up and down cursor control arrows activated by softkeys 1 and 2, a select key activated by softkey 3, and an exit key activated by softkey 4. Use of such a scrolling display permits selection from among a greater number of options than there are softkeys.

The controller initially checks whether a softkey has been pressed (step 63) and, if so, checks whether the softkey corresponds to the scroll up or down keys (steps 64 and 65), in which case corresponding registers are incremented or decremented (steps 66 and 67) to keep track of the cursor position. Upon pressing the select key (step 68), the controller checks for the status of a pointer or flag in the register (step 69). If the flag indicates continuity verification has been selected (step 70), the controller displays the continuity verification prompt illustrated in FIG. 4A (step 71). Similarly, if the flag indicates that AC or DC hipot, or insulation resistance verification has been selected (steps 72,73,74), the controller displays the corresponding prompts illustrated in FIGS. 5A, 6A, and 7A (steps 75,76,77,78). On the other hand, if the softkey corresponding to "exit" has been selected (step 79), the controller exits the verification mode and displays a main test menu (step 80).

Figure 4B:
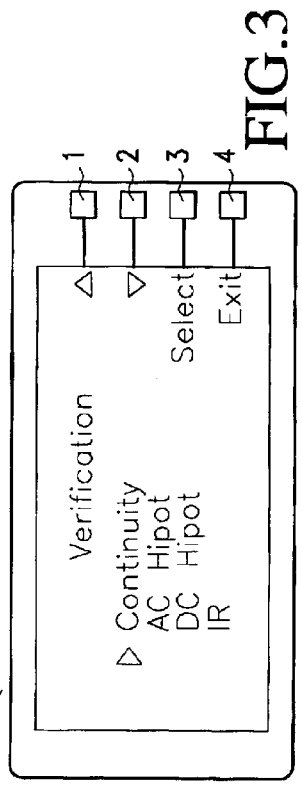
Figure 4A:
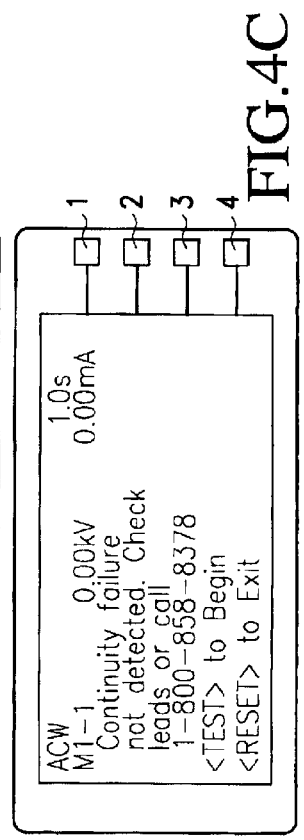
Figure 4C:
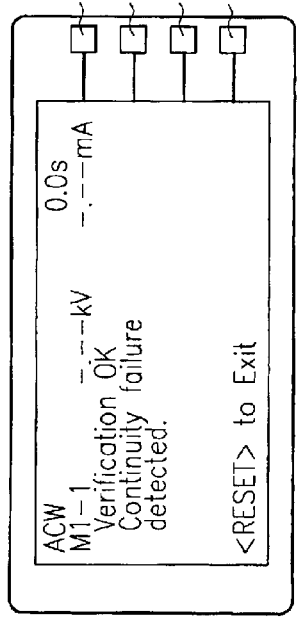
Figure 6A:
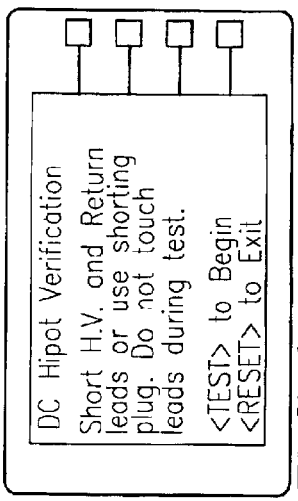
Figure 5A:
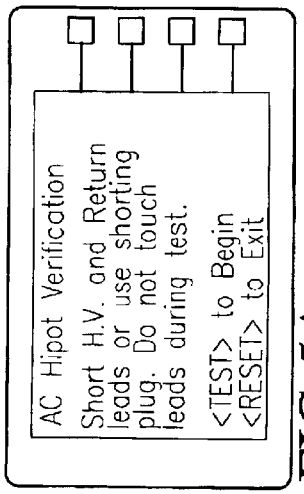

Each of the verification prompts illustrated in FIGS. 5A, 6A, and 7A indicates the connections that must be made by the user in order to perform verification for the corresponding safety compliance tests. For example, in the case of continuity tests, as indicated in FIG. 4A, the user must disconnect high voltage and return leads from the instrument so that the continuity test terminals are disconnected. If the continuity test circuitry is working properly, the system should detect the failure of continuity resulting from disconnection of the leads. This check is initiated by pressing the reset button 12 on the main panel of the tester, and thus the system waits for the user to push the test button 12 on front panel 18(step 81) to initiate the test (step 82), or the reset button 13 (step 83) to exit the verification mode. Upon completion of the continuity test (step 84), if the continuity detection circuitry returns an indication that a continuity failure has been detected, the system displays a "verification OK" message (step 85), as illustrated in FIG. 4B, and waits for the reset button 13 to be pressed in order to exit the verification mode (step 86). However, if the continuity failure is not detected, the system displays a prompt instructing the user to try again or seek assistance (step 87), as illustrated in FIG. 4C, and waits for the test button 12 to be pressed in order to re-test, or for the reset button 13 to be pressed in order to exit the verification mode.

Figure 6B:
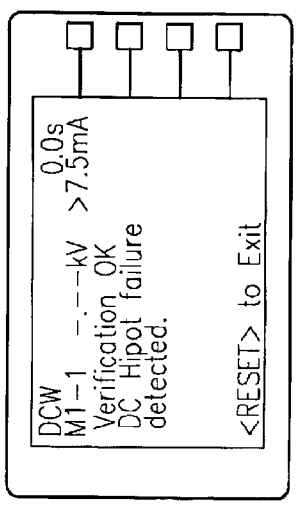
Figure 6C:
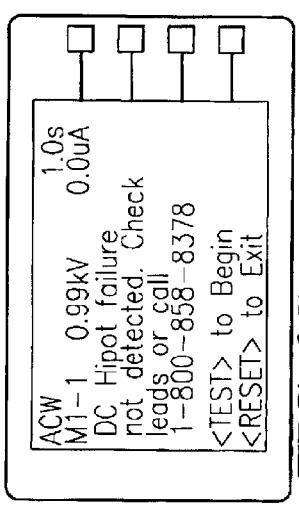
Figure 5B:
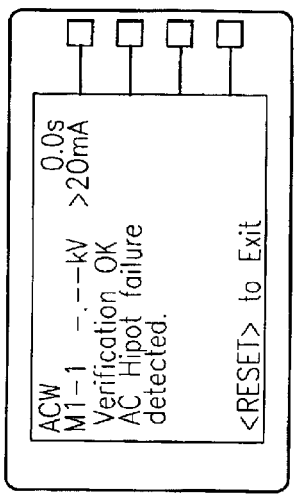
Figure 5C:
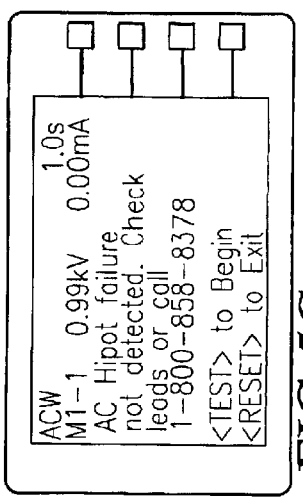

Similarly, in the case of DC hipot, AC hipot, or insulation resistance tests, as indicated respectively in FIGS. 5A, 6A, and 7A, the user must short the high voltage and return leads to simulate an insulation discontinuity. If the high voltage test circuitry is working properly, the system should detect the resulting "leakage" current. These checks are again initiated by pressing the test button 12 on the main panel of the tester, and thus the system waits for the user to push the test button 12 on front panel 18(steps 88,89,90) to initiate the test (steps 91,92,93), or the reset button 13 (steps 94,95,96) to exit the verification mode. Upon completion of the respective AC hipot, DC hipot, or insulation resistance tests (steps 97,98,99), if the leakage current detection circuitry returns an indication that the appropriate leakage current has been detected, the system displays a "verification OK" message (steps 100,101,102), as illustrated in FIGS. 5B, 6B, and 7B and waits for the reset button 13 to be pressed in order to exit the verification mode (steps 103,104,105). However, if the appropriate leakage current is not detected despite the shorted high voltage and return terminals, the system displays a prompt instructing the user to try again or seek assistance (step 106,107,108), as illustrated in FIG. 4C, and waits for the test button 12 to be pressed in order to re-test, or for the reset button 13 to be pressed in order to exit the verification mode.

It will of course be appreciated by those skilled in the art that the steps illustrated in FIG. 8 are not exclusive, and that the functions and features of the preferred embodiment of the invention may be carried out in different orders using variations of the menus and submenus illustrated in FIGS. 3, 4A–4C, 5A–5C, 6A–6C, and 7A–7C, that functions and features may be added or deleted, and that details of the functions and features described above may be varied depending on the nature of the safety compliance tests to be carried out by the safety compliance instrument to which the operator interface of the invention is applied.

As a result, although a preferred embodiment of the invention in sufficient detail to enable those skilled in the art to make and use the invention, it will nevertheless be appreciated that numerous variations and modifications of the illustrated safety compliance instrument and operator interface therefor may be made without departing from the spirit of the invention. As a result, it is intended that the invention not be limited by the above description or accompanying drawings, but rather that the invention be defined solely in accordance with the appended claims.

I claim:

1. A verification method for a safety compliance instrument, to check whether the safety compliance instrument will detect failure by a product to pass a safety compliance test, comprising the steps of:

displaying a verification test-select menu upon power-up of the instrument;

upon selection of a verification test, instructing an operator on which connections to make for the selected test, and instructing the operator on how to initiate verification by activating a test initiation input;

upon completion of the test, indicating the result of the selected verification test by displaying one of a verification successful message and a failure to verify message.

2. A verification method as recited in claim 1, wherein the verification test-select menu lists at least two different safety compliance tests involving different connections to a device under test.

3. A verification method as recited in claim 2, wherein the tests are selected from the group consisting of a continuity test, a ground test, a dielectric withstand test, and an insulation resistance test.

4. A verification method as recited in claim 2, wherein the tests are selected from the group consisting of a continuity test, a ground bond test, AC and DC dielectric withstand tests, and an insulation test.

5. A verification system for verifying whether a test instrument will properly detect failure of a product to pass a safety compliance test, comprising:

means including display control software for displaying a verification test-select menu upon power-up of the instrument;

means for, upon selection of a verification test, instructing an operator on which connections to make for the selected test, and instructing the operator on how to initiate verification by activating a test initiation input;

means for, upon completion of the test, indicating the result of the verification test by displaying a verification successful message or a failure to verify message.

6. A verification system as recited in claim 5, wherein the verification test-select menu lists at least two different safety compliance tests involving different connections to a device under test.

7. A safety compliance instrument as recited in claim 6, wherein the tests are selected from the group consisting of a continuity test, a ground test, a dielectric withstand test, and an insulation resistance test.

8. A safety compliance instrument as recited in claim 6, wherein the tests are selected from the group consisting of a continuity test, a ground bond test, AC and DC dielectric withstand tests, and an insulation test.

9. A safety compliance test instrument having a display capable of displaying prompts, a menu display program, and software for displaying a plurality of instrument menus, wherein said instrument menus include verification menus, prompts, and messages concerning results of the verification tests, and software for enabling or preventing safety compliance tests from being performed depending on results of the verification.

10. A safety compliance instrument as recited in claim 9, wherein the safety compliance instrument includes at least two different safety compliance tests involving different connections to a device under test.

11. A safety compliance instrument as recited in claim 10, wherein the tests are selected from the group consisting of a continuity test, a ground test, a dielectric withstand test, and an insulation resistance test.

12. A safety compliance instrument as recited in claim 10, wherein the tests are selected from the group consisting of a continuity test, a ground bond test, AC and DC dielectric withstand tests, and an insulation test.

13. A safety compliance instrument as recited in claim 9, wherein the display is a softkey-controlled display.

* * * * *